United States Patent
Takita et al.

(10) Patent No.: US 6,821,685 B2
(45) Date of Patent: Nov. 23, 2004

(54) BLOCK MASK MAKING METHOD, BLOCK MASK AND EXPOSURE APPARATUS

(75) Inventors: Hiroshi Takita, Kawasaki (JP); Hiromi Hoshino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 269 days.

(21) Appl. No.: 10/093,803

(22) Filed: Mar. 11, 2002

(65) Prior Publication Data

US 2003/0003375 A1 Jan. 2, 2003

(30) Foreign Application Priority Data

Jun. 29, 2001 (JP) ........................................ 2001-199180

(51) Int. Cl.[7] ................................................ G03F 9/00
(52) U.S. Cl. ............................................ 430/5; 430/30
(58) Field of Search ................................. 430/5, 30, 22

(56) References Cited

U.S. PATENT DOCUMENTS 5,824,437 A * 10/1998 Sakakibara et al.
5,917,579 A * 6/1999 Miyajima
6,225,025 B1 * 5/2001 Hoshino

OTHER PUBLICATIONS

Patent Abstract of Japan, publication No. 08–050874, publication date Feb. 20, 1996.

* cited by examiner

*Primary Examiner*—Saleha R. Mohamedulla
(74) *Attorney, Agent, or Firm*—Arent Fox PLLC

(57) ABSTRACT

A block mask making method is provided that can improve throughput of a process for exposing a semiconductor device having a plurality of layers. Steps S20–S22 respectively extract blocks including basic figures included in layers of IC data. For example, step S20 extracts a block from a wiring layer, and step S21 extracts a block from a gate layer, step S22 extracting a block from a hole layer. In step S23, if the number of blocks extracted by steps S20–S22 is larger than the number of blocks that can be arranged on the block mask, blocks that are used frequently are selected preferentially. Step S24 determines arrangement of a block having a smaller exposure pattern closer to a center of the block mask. Data in which arrangement is fixed is output as block mask making data.

10 Claims, 22 Drawing Sheets

BLOCK MASK MAKING METHOD, BLOCK MASK AND EXPOSURE APPARATUS

BACKGROUND OF THE INVENTION (1) Field of the Invention

The present invention generally relates to block mask making methods, block masks and exposure apparatuses. More particularly, the present invention relates to a method of making a block mask used for pattern batch exposure, such a block mask, and an exposure apparatus using the same.

(2) Description of the Related Art

An exposure process for forming desired patterns on a wafer such as a semiconductor substrate is performed in the process of fabricating semiconductor integrated circuit (IC) devices.

Electron beam exposure for drawing patterns with an electron beam is known as an exposure method as described above. However, the electron beam exposure is so-called a single-stroke method in which patterns are painted out by a beam with its cross section shaped into a rectangle. Therefore, the electron beam exposure has a disadvantage in that the finer the pattern, the lower the throughput in wafer production.

For the purpose of eliminating the above disadvantage, a throughput-improved method has been developed in which a block mask having pattern-shaped openings are arranged in the position of the second aperture of an electron beam exposure apparatus, these patterns being drawn in batch fashion.

FIG. 20 is a diagram of steps of a conventional exposure procedure using the block mask. As is shown in this figure, IC data 10 for designing an IC is processed in step S10 of producing exposure data. This step results in wafer exposure data 11 and block mask making data 12. The block mask making data 12 is used to make a block mask 13. The wafer exposure data 11 describes an exposure procedure with the block mask 13.

Next, the block mask 13 is produced based on the block mask making data 12. In the block mask 13, approximately 100 blocks are formed each having a size of 5 μm×5 μm. Each block is subjected to exposure and is transferred on a wafer 14 in batch fashion.

In an exposure step S11 following step S10, an electron beam from a beam source of the exposure apparatus is projected onto a given block of the block mask 13 designated by the wafer exposure data 11. The beam passes through the given block and forms an image on a target area on the wafer 14.

The above exposure process is repeated, so that patterns corresponding to a designed integrated circuit can be transferred on the wafer 14.

FIG. 21 is a view of an outline of the conventional exposure apparatus. As is shown in this figure, the exposure apparatus is made up of an electronic gun 20, a first aperture 21, a deflector 22, the block mask 13, and another deflector 23.

The electron beam emitted from the electronic gun 20 is shaped by the first aperture 21, and is adjusted by the deflector 22 so as to be irradiated onto a given block of the block mask 13. The electron beam passing through the block mask 13 is adjusted so as to form an image of the pattern on a given area on the wafer 14, so that the pattern can be transferred thereon. The above process is repeated until all patterns are transferred on the wafer 14.

The wafer exposure data 11 is used to control the deflectors 22 and 23 and a stage on which the wafer 14 is placed.

As described above, the exposure method with the block mask makes it possible to transfer each pattern of the block mask on the wafer in batch fashion. Thus, the block mask exposure method has a higher throughput than that of the so-called single stroke exposure method.

By the way, generally, IC data is formed by a plurality of layers (for example, a wiring layer, a gate layer, and a hole layer). Conventionally, as is shown in FIG. 22, a block mask is made for each layer, and exposure is performed on the layer basis. Similarly, a block mask is formed for each layer of each piece of IC data formed by identical or different basic figures.

An example in FIG. 22 shows a case where IC data consist of IC data 30 for a wiring layer, IC data 31 for a gate layer, and IC data 32 for a hole layer. Blocks extracted from the respective IC data are arranged on the block mask, so that the respective mask block for each layer can be formed. For example, blocks 30a through 30d are extracted from the IC data 30, and a block mask 33 including these blocks is made.

In exposure using the respective block mask for each layer, the block mask of the layer to be drawn is loaded to the exposure apparatus.

However, the above method needs the respective block mask for each layer, and is therefore expensive. Further, the method takes a long time to make the masks. Furthermore, the block mask is exchanged on the layer basis. This reduces throughput.

SUMMARY OF THE INVENTION

Taking into the above into consideration, an object of the present invention is to provide a block mask making method, a block mask and an exposure apparatus capable of reducing the cost without reducing throughput of the exposure apparatus.

The above object of the present invention is achieved by a method of making a block mask used for pattern batch exposure, comprising: an extraction step of extracting blocks from basic figures that belong to one or more layers of a semiconductor device and form an integrated circuit; and an arrangement determining step of determining an arrangement of the blocks extracted by the extraction step on a block mask.

The above object of the present invention is also achieved by a block mask used for pattern batch exposure, the block mask being made by: extracting blocks from basic figures forming an integrated circuit that belongs to one or more layers of a semiconductor device; and determining an arrangement of the extracted blocks on the block mask.

The above object of the present invention is also achieved by an exposure apparatus drawing a circuit pattern on a semiconductor substrate by exposure made by steps of: extracting blocks from basic figures forming an integrated circuit that belongs to one or more layers of a semiconductor device; and determining an arrangement of the extracted blocks on the block mask.

The above and other objects, features and advantages of the present invention will become more apparent from the following description when taken into conjunction with the accompanying drawings which illustrate preferred embodiments of the present invention by way of example.

DESCRIPTION OF THE PREFERRED EMBODIMENTS

Figure 1:
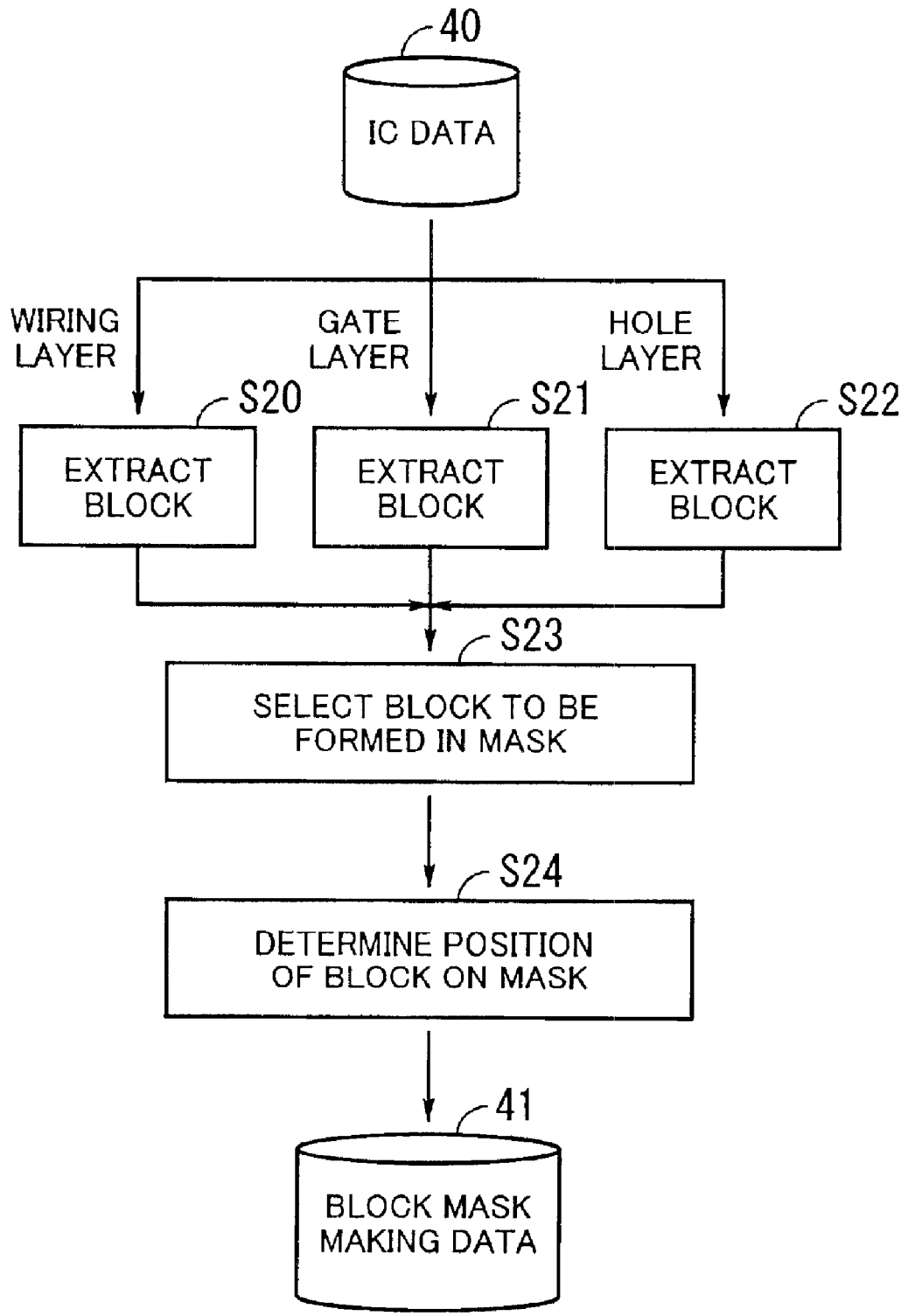
FIG. 1 is a view of an embodiment of the block mask making method of the invention.

FIG. 1 is a view of an embodiment of the block mask making method of the invention. First, blocks are extracted from IC data 40 on the layer basis by steps S20–S22. For example, blocks for a wiring layer are extracted in step S20, and blocks for a gate layer are extracted in step S21, blocks for a hole layer being extracted in step S22.

In step S23, blocks to be formed in a mask are selected from among all the blocks extracted by steps S20–S22. More particularly, as will be described layer, priority for selection is given to blocks having a comparatively large number of reduced shots (which is equal to the result of subtracting the number of times block exposure is performed from the number of times variable rectangular beam exposure is performed) for an identical pattern. In selection, if there are overlapping blocks, these blocks are unified.

In step S24, the positions of the blocks picked up in step S23 on the mask block are determined in accordance with a predetermined rule. For example, the predetermined rule is such that the smaller the size of the minimum figure included in the block, the closer to the center of the mask the figure is arranged, as will be described later.

The data produced in step S24 is stored as block mask making data 41.

Figure 4:
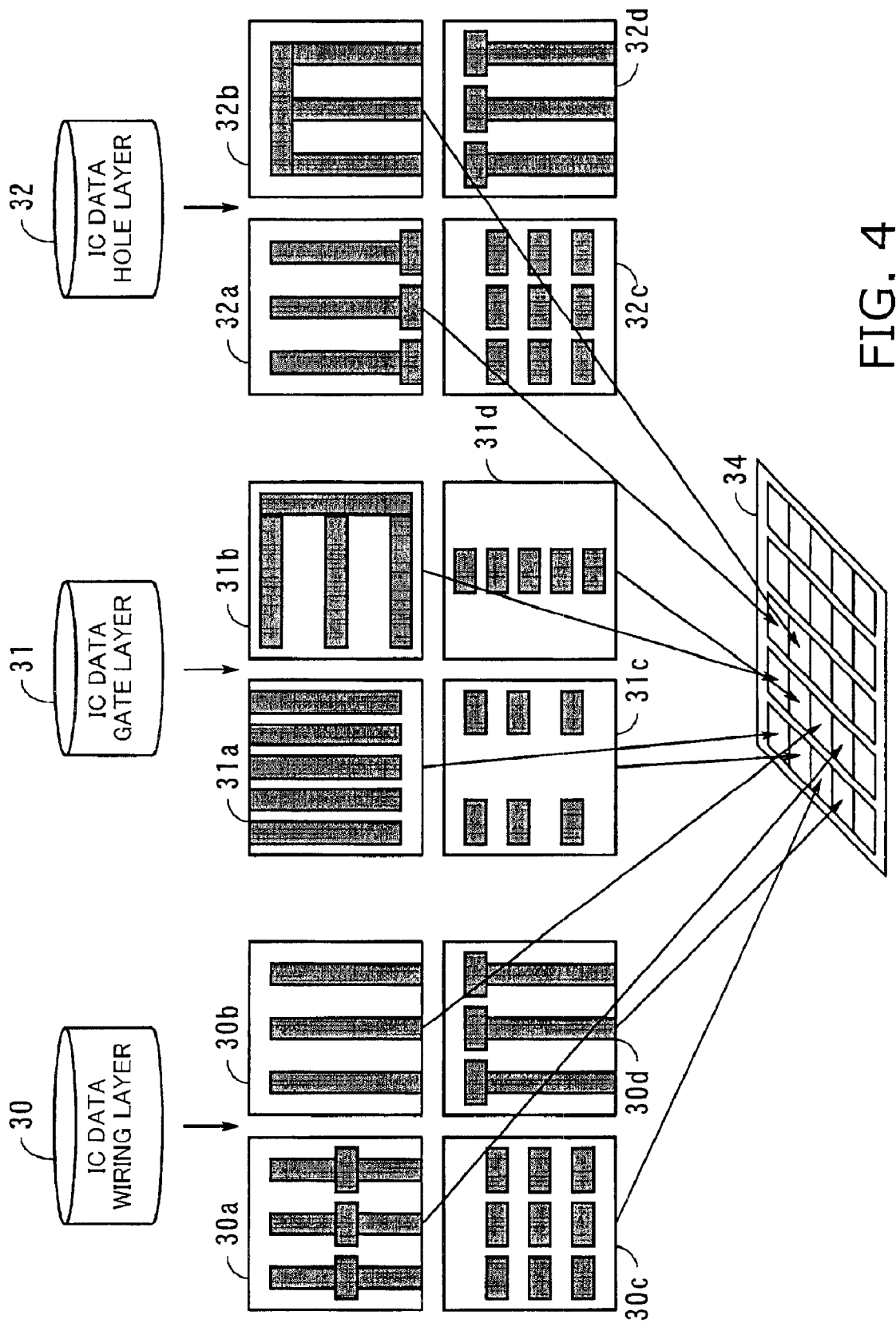
FIG. 4 is a view of an outline of the procedure shown in FIG. 1.

FIG. 4 shows the outline of the above process.

As is shown in this figure, blocks 30a–30d are extracted from the IC data 30 of the wiring layer. Blocks 31a–31d are extracted from the IC data 31 of the gate layer. Blocks 32a–32d are extracted from the IC data 32 of the hole layer.

Among the blocks extracted, blocks 30c and 32c are the same and are thus unified. Similarly, blocks 30d and 32d are the same and are thus unified. Finally, only the blocks 30c and 30d are selected.

In the example shown in FIG. 4, the number of blocks that can be arranged on a block mask 34 is greater than the number of blocks extracted. Therefore, all the extracted blocks may be arranged on the block mask 34. Otherwise, blocks are selected or discarded in accordance with a rule, which will be described later. The blocks thus selected are arranged on the block mask in a rule which will be described later, so that exposure precision and throughput can be improved.

Figure 5:
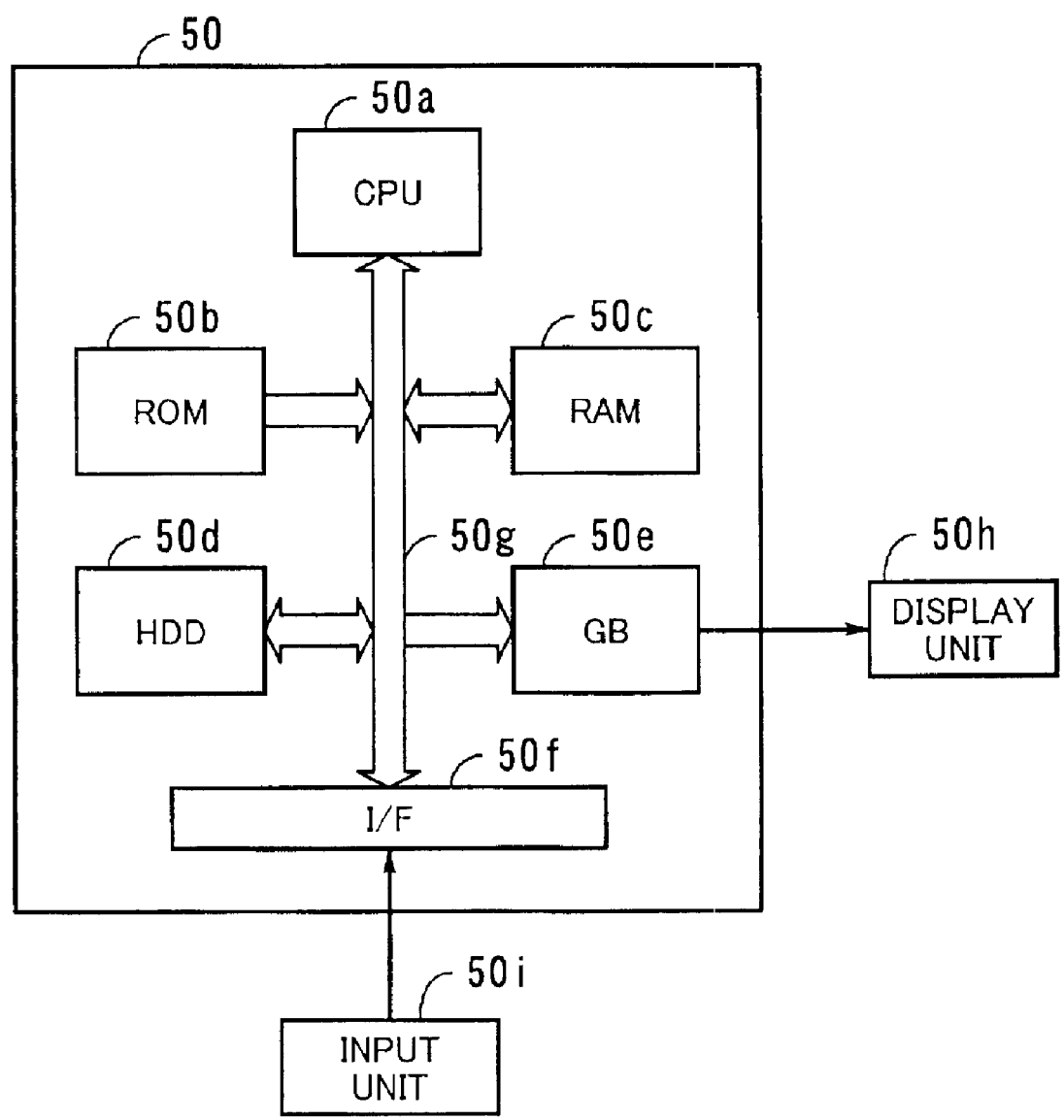
FIG. 5 is a block diagram of a computer that processes block data.

The block data is processed by a computer as shown in FIG. 5. A computer 50 shown in this figure includes a CPU (Central Processing Unit) 50a, a ROM (Read Only Memory) 50b, a RAM (Random Access Memory) 50c, an HDD (Hard Disk Drive) 50d, a GB (Graphics Board) 50e, an I/F (Interface) 50f, a bus 50g, a display unit 50h, and an input unit 50i.

The CPU 50a executes various operations in accordance with programs stored in the HDD 50d, and controls the parts of the apparatus. The ROM 50b stores primary programs executed by the CPU 50a. The RAM 50c temporarily stores data and program being processed by the CPU 50a. The HDD 50d stores programs executed by the CPU 50a and IC data. The GB 50e executes a drawing process in response to drawing instructions issued by the CPU 50a, and converts image data thus obtained into a video signal, which is supplied to the display unit 50h. The I/F 50f changes the format of data from the input unit 50i. The bus 50g mutually connects the CPU 50a, ROM 50b, RAM 50c, HDD 50d, GB 50e and I/F 50f, and allows data to be transferred therebetween.

Figure 6:
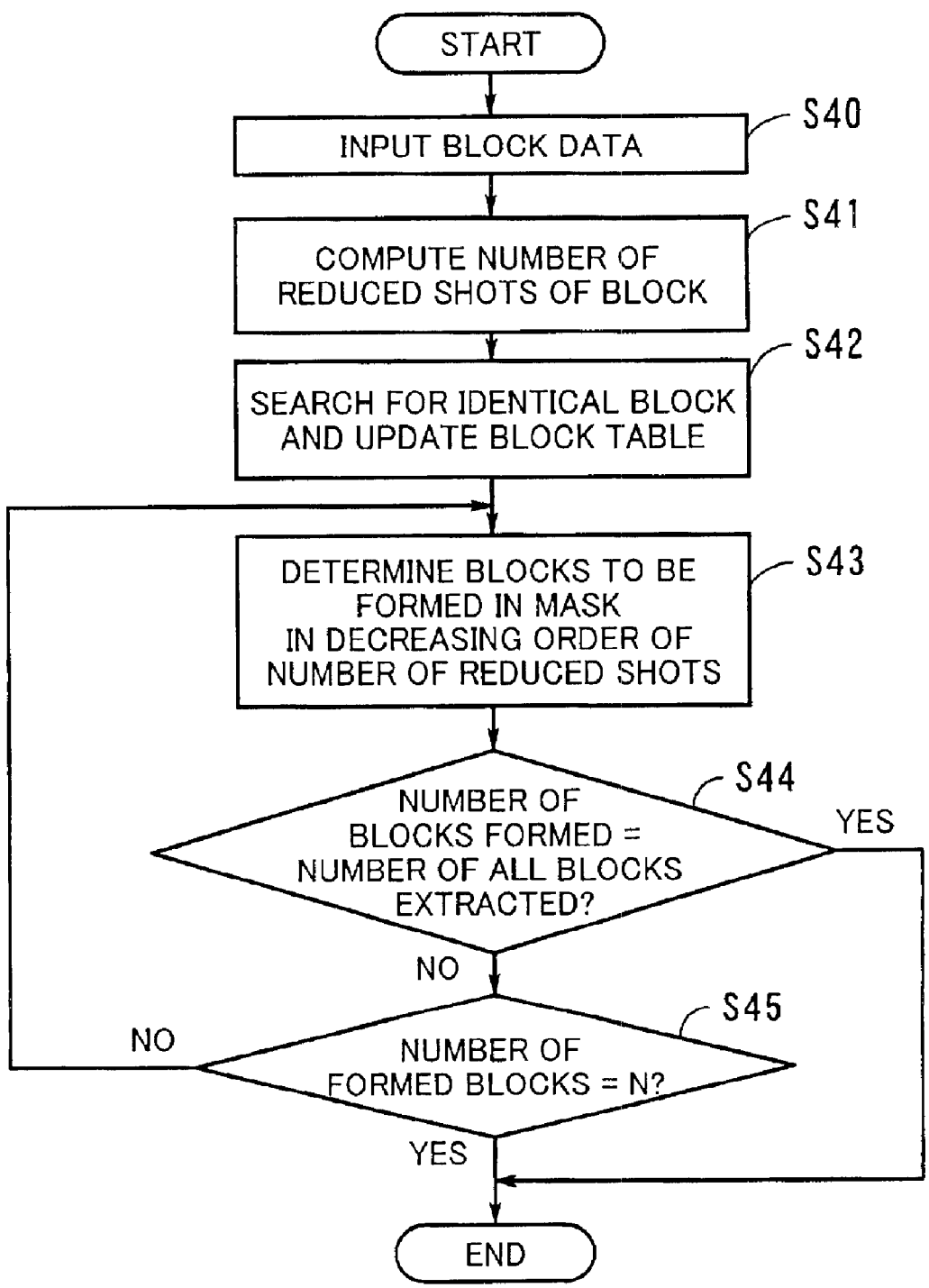
FIG. 6 is a flowchart of the details of step S23 shown in FIG. 1.

FIG. 6 is a flowchart of the details of step S23 shown in FIG. 1. The flowchart selects blocks to be formed in the block mask. After the flowchart starts, the following steps are executed sequentially.

In step S40, the CPU 50a inputs the block data extracted by steps S20–S22. In step S41, the CPU 50a computes the number of reduced shots by using block exposure. The number of shots to be reduced may be obtained by subtracting the number of reduced shots in block exposure from that of shots in variable rectangular beam exposure. As the number of reduced shots increases, block exposure can be performed by the smaller number of shots than that in variable rectangular beam exposure.

For instance, a block consisting of three rectangles can be exposed by performing the drawing step three times by the variable rectangular beam exposure. In contrast, the same block can be exposed by performing the drawing only at one time by batch exposure. Thus, the number of reduced shots is "2" (=3–1) for the above case.

In step S42, the CPU 50a searches for the same block in order to avoid double registration of block, and updates a block table that will be described later.

Figure 7:
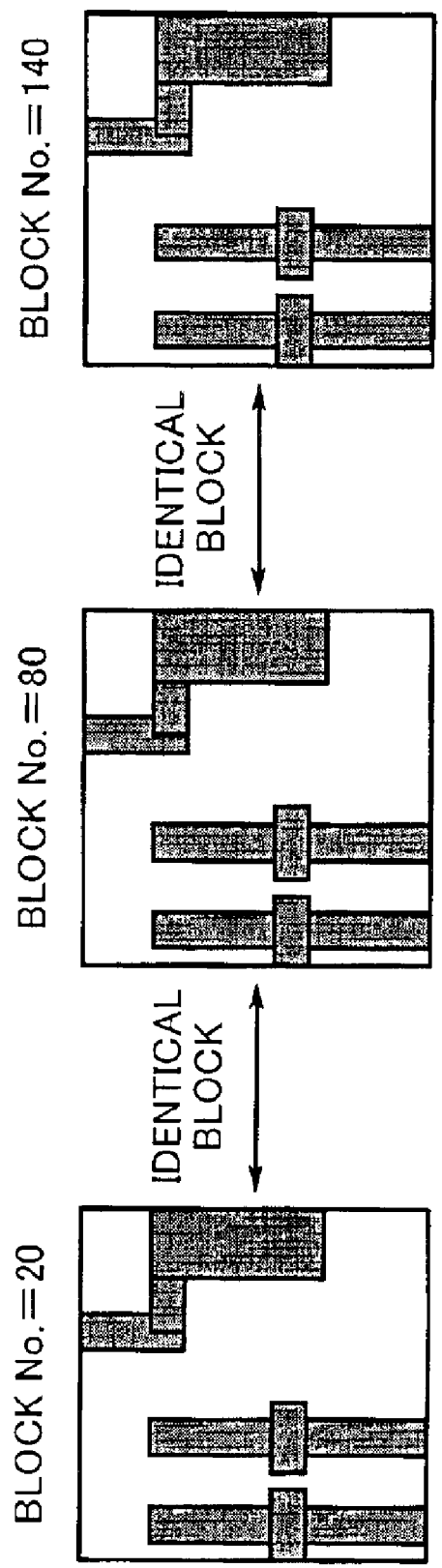
FIG. 7 is a view of an example of identical blocks with an identical pattern to be drawn.

FIG. 7 is a view of an example of identical blocks with an identical pattern to be drawn. In the example illustrated, block numbers 20, 80 and 140 have the same pattern. It is possible to determine whether patterns are the same as each other by comparing the coordinates of the apexes of rectangular patterns included in the blocks with each other.

Figure 8:
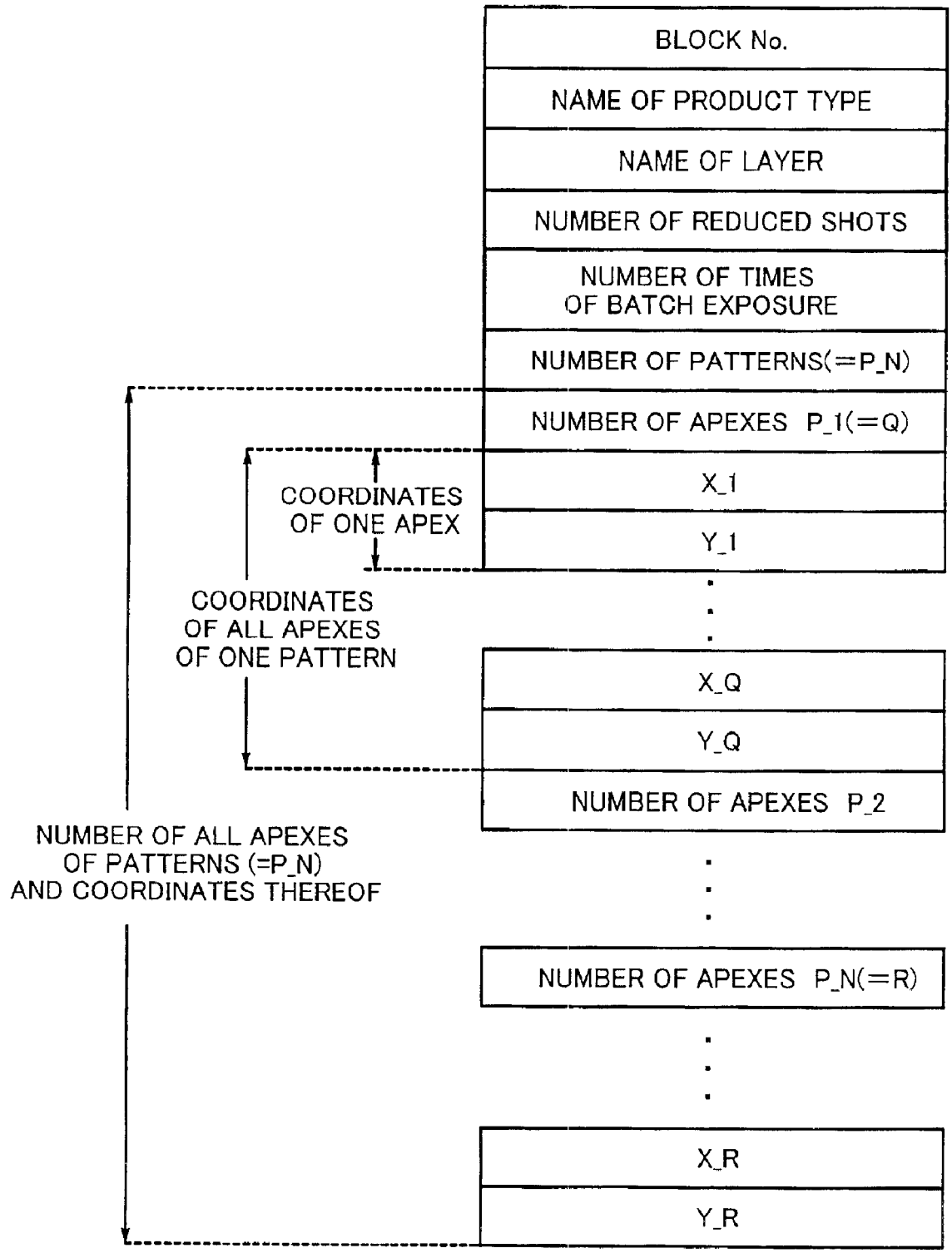
FIG. 8 is a view of a block table.

FIG. 8 illustrates a block table. As is illustrated, the block table is made up of a block number, name of product type, name of layer, the number of reduced shots, the number of times of batch exposure, the number of patterns, the number of apexes, and data of the coordinates of apexes.

The block number is a serial number assigned to each block. The name of product type indicates the type of IC such as DRAM (Dynamic Random Access Memory). The name of layer is the name of layer to which the block belongs, such as a wiring layer, gate layer or hole layer. The number of reduced shots is obtained by subtracting the number of times of block exposure from the number of times of variable rectangular beam exposure. The number of times of batch exposure is performed is the number of exposure times by batch exposure. The number of patterns indicates the number of patterns included in the block. The number of apexes indicates the number of apexes of the pattern. The coordinates of apexes indicate the coordinates of all apexes included in one pattern. The coordinates of a single apex may be described as (X_1, Y_1). A single block is formed by a plurality of patterns.

In step S42, blocks having the same patterns are searched for by comparing the coordinates of apexes in the respective block tables. If such blocks are identified, the respectively block numbers are unified for avoidance of double registration.

Figure 9:
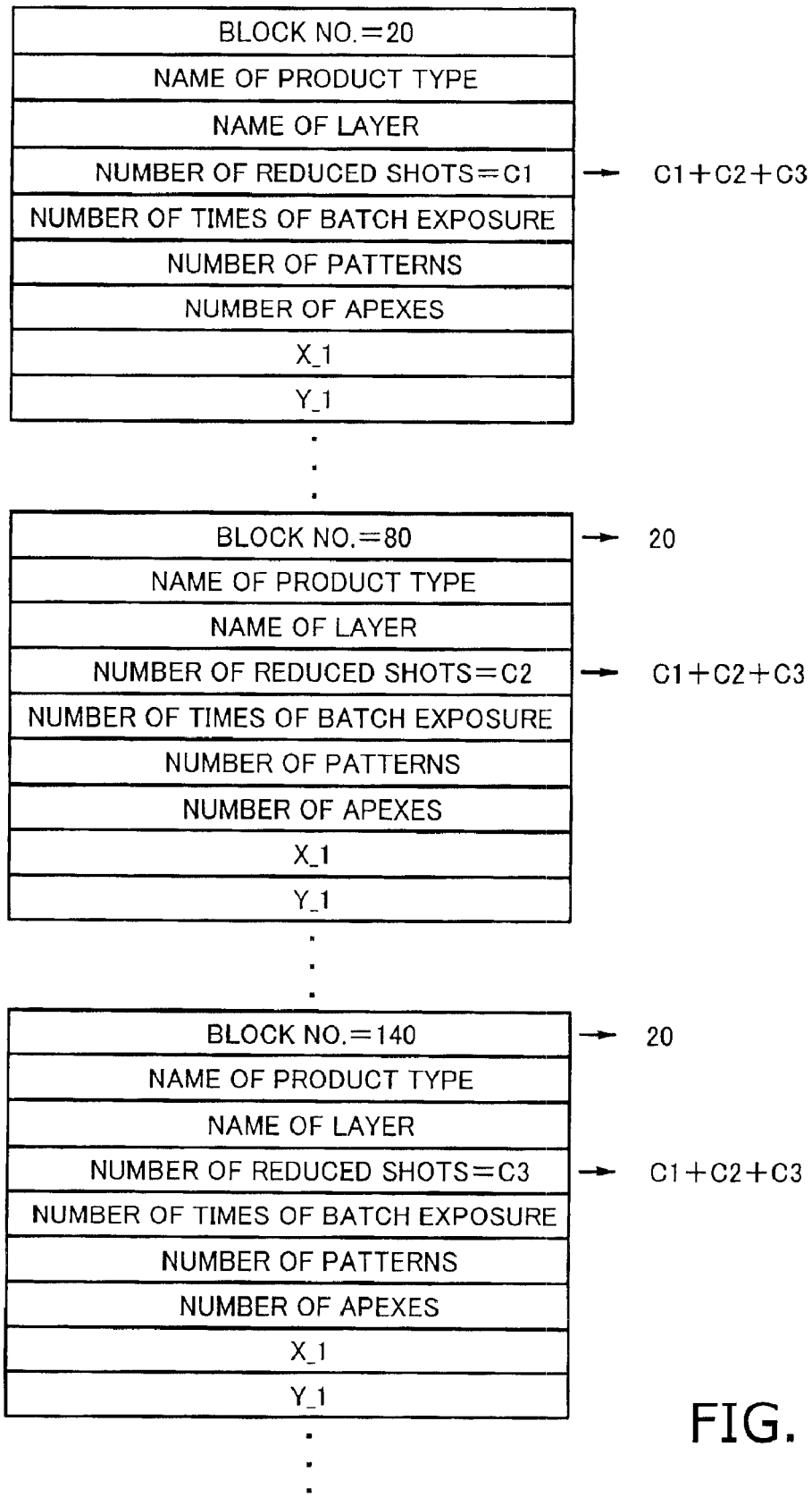
FIG. 9 is a view of a block table corresponding to the blocks shown in FIG. 7.

FIG. 9 shows block tables of the blocks shown in FIG. 7. In the example of FIG. 9, block numbers 80 and 140 are unified in block number 20.

Next, the reduced number of shots is made to assume the sum of the numbers of items of block data in all the blocks. This is because the number of shots can be very much reduced for the overlapping blocks. The above makes it possible for the overlapping blocks to be selected preferentially.

In step S43, the CPU 50*a* determines the order of forming so that it starts from the block with the largest number of shots that can be reduced.

In step S44, the CPU 50*a* determines whether the number of blocks to be formed (the number of blocks that have been chosen for forming) is equal to the number of all blocks extracted by steps S20–S22. If the answer is affirmative, the CPU 50*a* recognizes that all the blocks have been processed and ends the process. Otherwise, the CPU 50*a* proceeds to step S45.

In step S45, the CPU 50*a* determines whether the number of blocks to be formed is equal to the number N of blocks that can be formed in the block mask (for example, N=100). If the answer is affirmative, the CPU 50*a* recognizes that all the blocks have been processed and ends the process. Otherwise, the CPU 50*a* returns to step S43 and the same process is repeated.

In the above-mentioned manner, the blocks can be selected so that the number of reduced shots in exposure can be reduced.

The above-mentioned embodiment of the present invention employs a single processor, namely only the single CPU 50*a*. Alternatively, a multiprocessor system can be employed in which a plurality of CPUs do respective jobs in parallel. The multiprocessor system may improve the processing speed.

Figure 10:
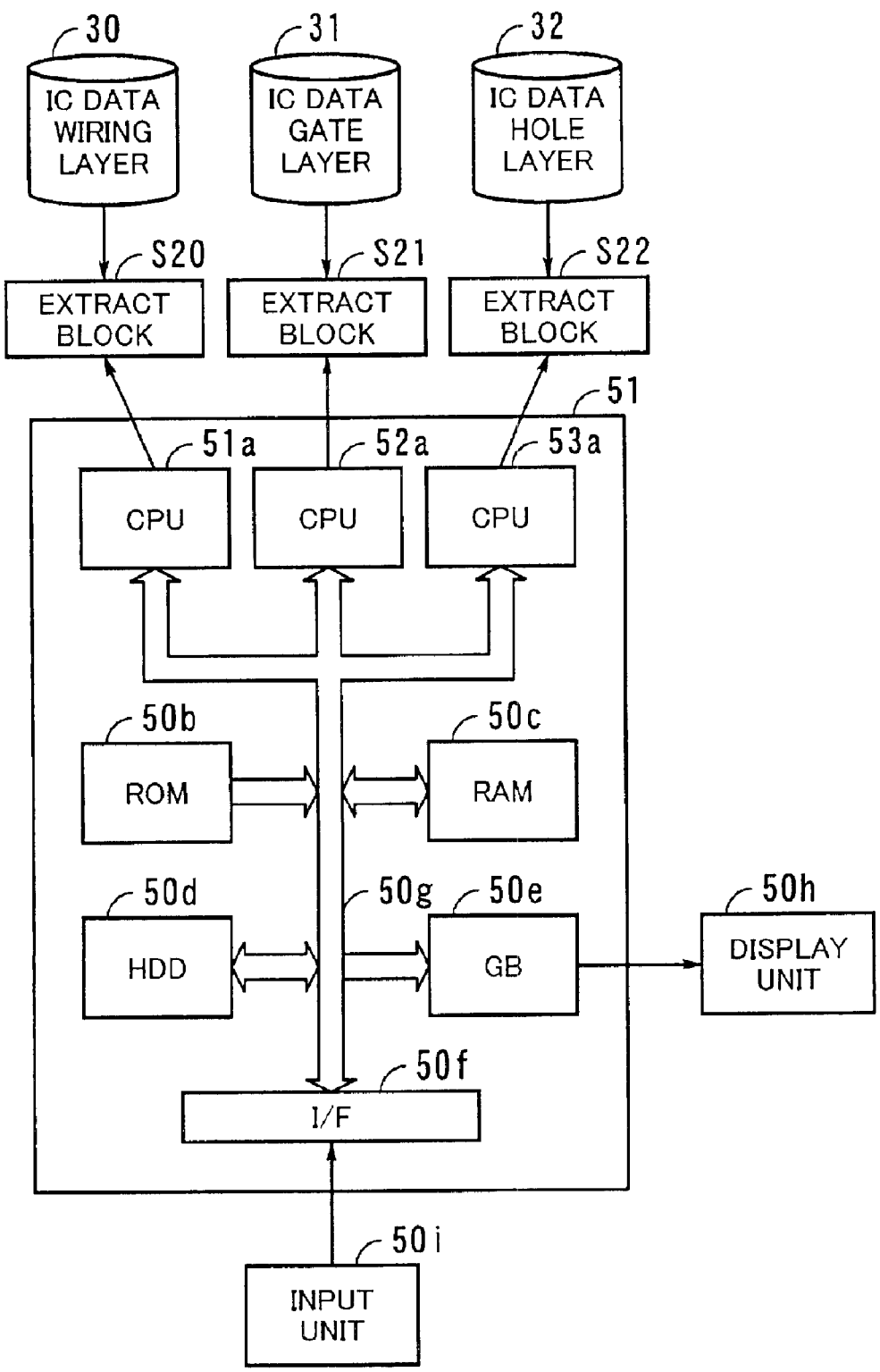
FIG. 10 is a block diagram of a computer equipped with a plurality of CPUs.

For example, as shown in FIG. 10, if the computer 51 includes CPUs 51*a*–53*a*, the block extraction for the items 30, 31 and 32 of IC data and the processes of steps S20–S22 can be distributed to the CPUs 51*a*–53*a*. For example, the CPU 51*a* handles step S20 and the CPU 52*a* handles step S21, while the CPU 53*a* handles step S22. This may reduce the time necessary for producing the block mask making data.

Next, a description will be given, with reference to FIG. 11, of a process for arranging the selected blocks on the block mask. This figure shows the details of step S24 shown in FIG. 1. After the flowchart starts, the following steps are performed sequentially.

In step S60, the CPU 50*a* inputs the block data of selected blocks obtained by the process shown in FIG. 6. It is now assumed that the block data has patterns of basic figures described below.

Figure 12:
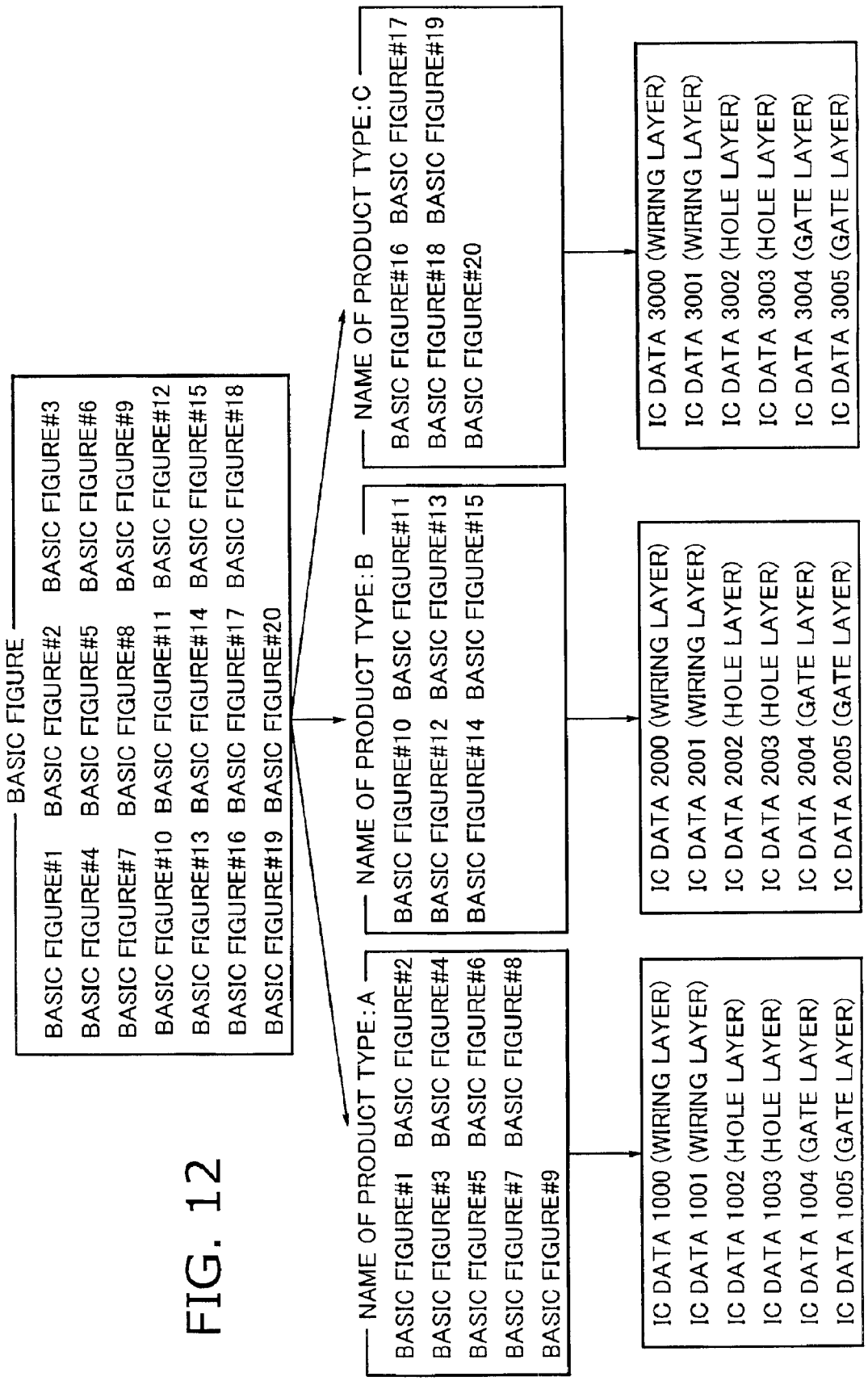
FIG. 12 is a view of a relationship among basic figures, product types and layer names.
Figure 13:
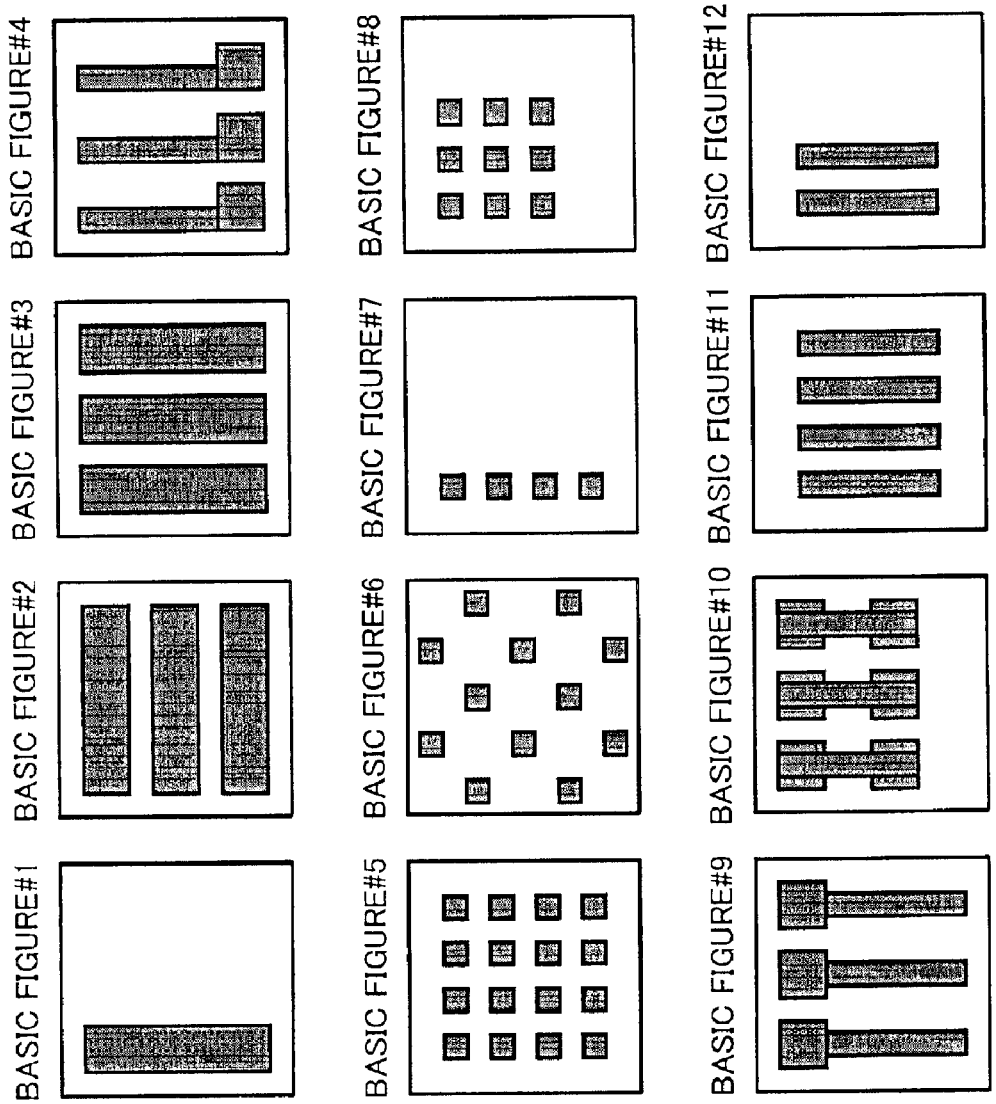
FIG. 13 is a view of basic figures.

FIG. 12 illustrates a relationship among the basic figures, the name of product type and the name of layer. FIG. 13 depicts examples of the basic figures.

In producing IC data, the types of basic figures used depend on the chip functions. For example, a group of items of IC data for the name of product type "A" is produced based on basic figures #1–#9. IC data 1000 and IC data 1001 for the name of product type "A" are both related to a wiring layer, but have different numbers of basic figures that should be arranged in different positions.

The "name of layer" indicates the name of IC data exposed in each step during the wafer production. A group of items of IC data for each product type includes data on the wiring layer, hole layer, gate layer and element isolation layer.

In FIG. 13, basic figures #1–#4 relate to the wiring layers, and basic figures #5–#8 relate to the hole layers, basic layers #9–#12 relating to the gate layers.

In step S61, the CPU 50*a* creates a block group table, in which a group of blocks extracted from IC data of the same product type and the same layer.

Figure 14:
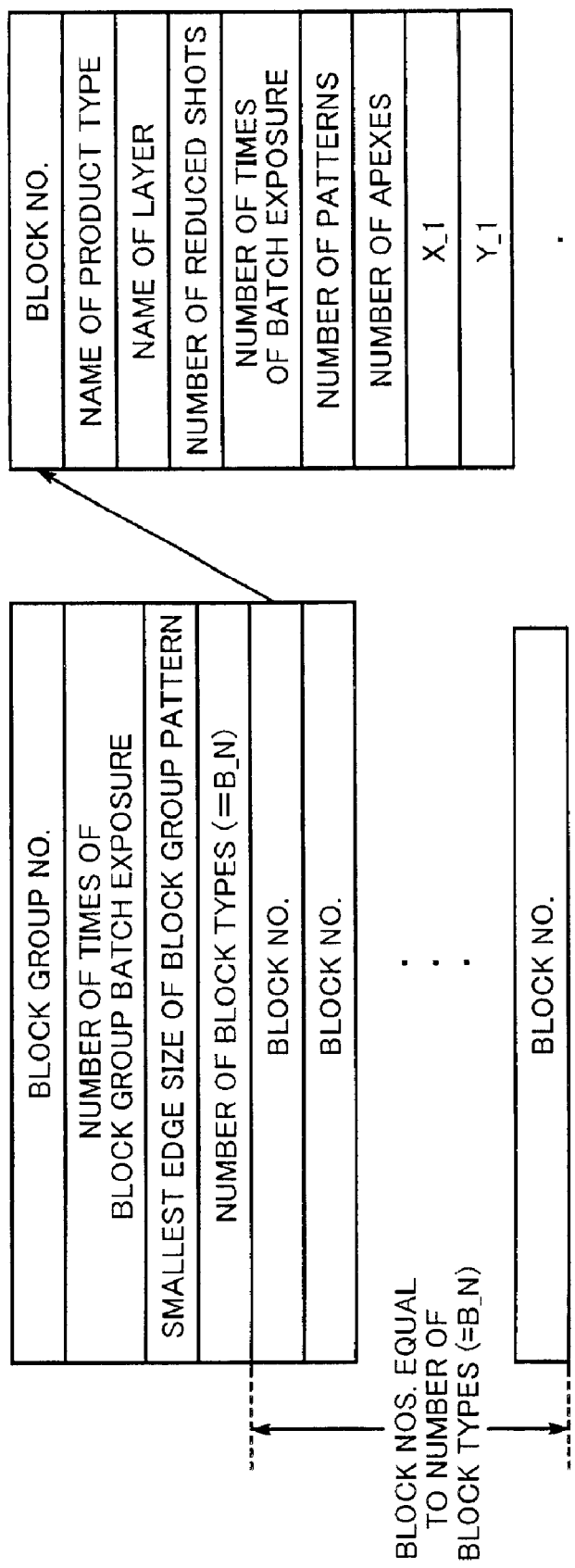
FIG. 14 is a view of a block group table.

FIG. 14 shows an example of the block group table. As is shown, the block group table is formed by a block group number, the number of times block group batch exposure is performed, the smallest edge size of block group pattern, the number of block types, and block number.

Here, the block group number is an identification number assigned to each block group. The number of times block group batch exposure is performed indicates the number of exposure times necessary for batch exposure of the block group. The smallest edge size of block group pattern indicates the smallest edge size out of the edges of all patterns included in all blocks of the block group. The number of block types indicates the type of blocks that belong to the block group. The block number is an identification number designating the blocks that belong to the block group.

In order that the CPU 50*a* creates the block group table, first, the CPU 50*a* refers to the name of product type and the name of layer stored in the block table shown in FIG. 8, and acquires data that belongs to the same layer of the same product type. The data thus acquired is stored in the block group table.

In the case of FIG. 12, blocks extracted from IC data 1000 and IC data 1001 belong to the same block group. Similarly, blocks extracted from IC data 1002 and IC data 1003 belong to the same block group.

In step S62, the CPU 50*a* computes the number of times block group batch exposure is performed, and stores it in the block group table. The number of times block group batch exposure is performed is the total of batch exposure times of all blocks that belong to the group.

In step S63, the CPU 50a recognizes the smallest edge size of the block group pattern, which is the shortest edge size among the sizes of the edges of all the patterns extracted from all the blocks of the block group.

In step S64, the CPU 50a executes a process for determining the position of the block arranged on the block mask. There are two arrangement methods described below.

1. First Method (1) First, the priority is assigned to the block groups in the decreasing order of the number of times of batch exposure. The priority order starts from 1, and increases one by one. The priority assigned to the block group having the largest number of times of batch exposure is "1", and the priority assigned to the block group having the second largest number of times of batch exposure is "2".

Figure 15:
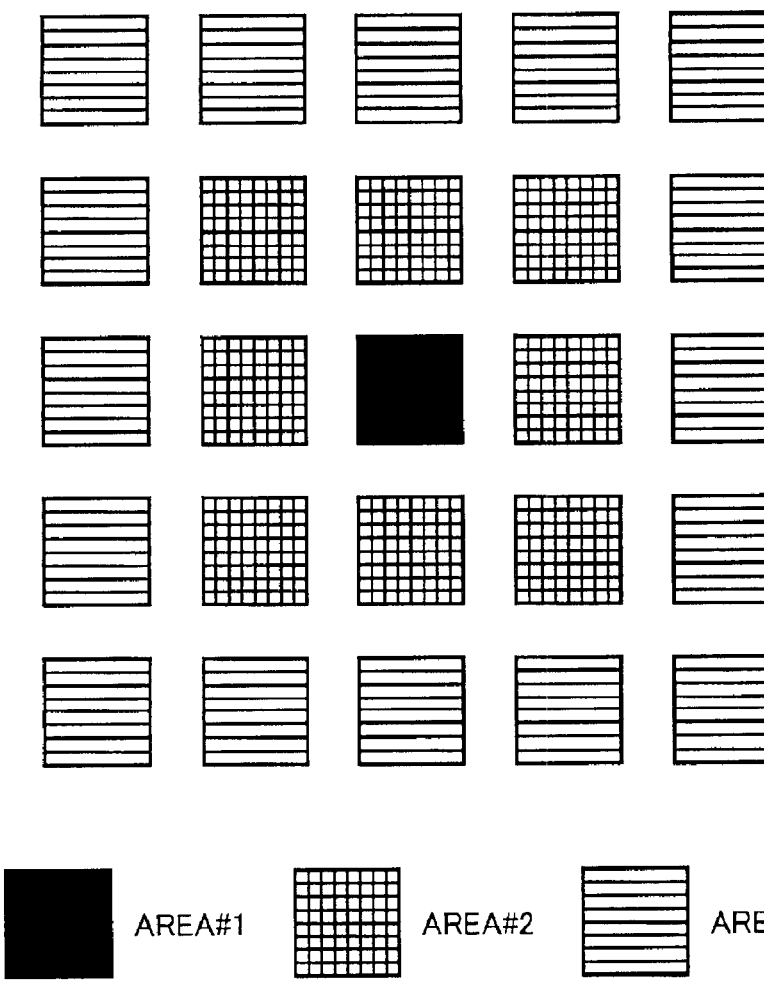
FIG. 15 is a view of an example of division of block masks.
Figure 15:
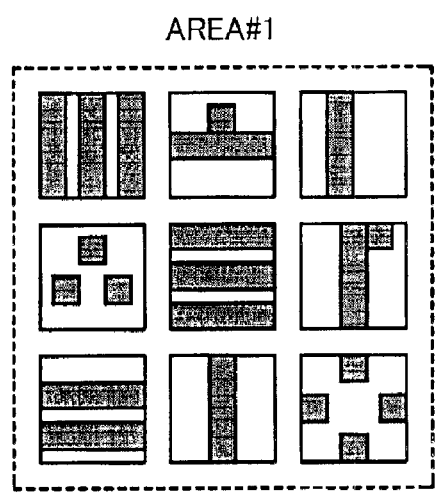

(2) Next, the arrangement position on the mask is determined for each block group. For example, as shown in FIG. 15, the mask is divided into 25 areas. The block group to which the highest priority "1" is assigned is arranged in area #1, and the block groups to which priorities 2–9 are respectively assigned are arranged in areas #2. Similarly, the block groups to which priorities 10–25 are respectively assigned are arranged in areas #3. The details of area #1 in which block groups have been arranged are illustrated in the lower part of FIG. 15.

2. Second Method (1) First, the priority is given to the block groups in the increasing order of the smallest edge size of the block group patterns. The priority order starts from "1", and increases one by one. The priority assigned to the block group having the smallest edge size is "1", and the priority assigned to the block group having the second smallest edge size is "2".

(2) Next, the arrangement position on the mask is determined for each block group. For example, as shown in FIG. 15, the mask is divided into 25 areas. The block group to which the highest priority "1" is assigned is arranged in area #1, and the block groups to which priorities 2–9 are respectively assigned are arranged in areas #2. Similarly, the block groups to which priorities 10–25 are respectively assigned are arranged in areas #3.

In step S65, the CPU 50a outputs to the HDD 50d, for example, the block mask making data, the positions of which have been determined, the block mask making data being stored in a given storage area.

A block having a relatively large number of times of drawing is arranged close to the center when the first method is employed. This contributes to reducing the distance of movement of the electron beam and speeding up the exposure process. When the second method is employed, a block having a relatively small size of pattern is arranged close to the center in which the electron beam is moved slightly with relatively high precision.

If there are many blocks, all the blocks will not be able to be arranged on the block mask. In this case, batch exposure is performed and variable rectangular beam exposure is performed with respect to parts that have not been exposed.

Since blocks that need a relatively large number of reduced shots are preferentially arranged on the mask, throughput may be improved even when variable rectangular beam exposure follows, as compared to the case where only variable rectangular beam exposure is employed.

A description will be given, with reference to FIGS. 2, 3, 16 and 17, of second and third embodiments of the present invention.

Figure 2:
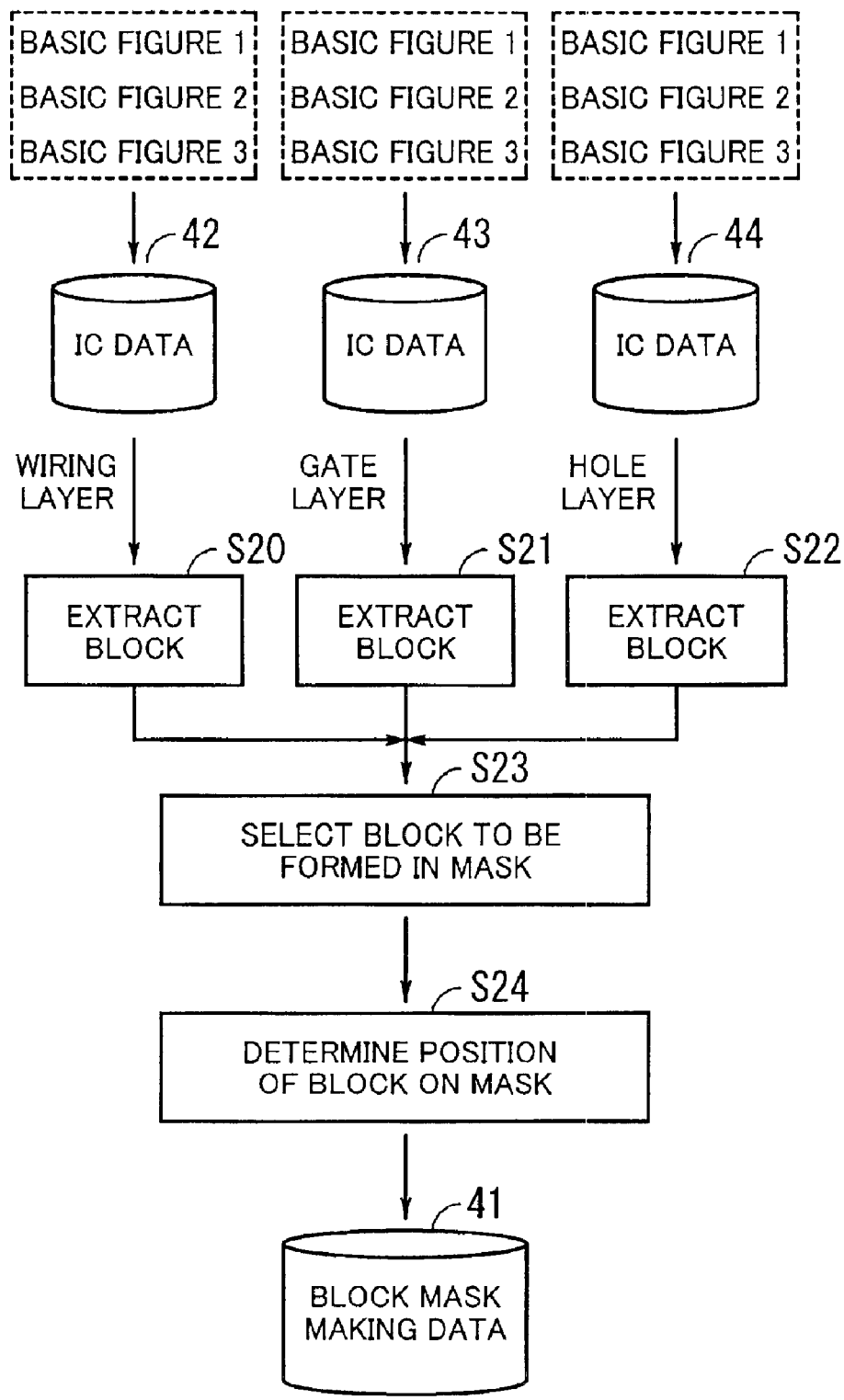
FIG. 2 is a view of another embodiment of the block mask making method of the invention.

The first embodiment of the present invention arranges blocks included in all layers of the same IC are properly selected and are arranged on the single block mask taking into account the positions of arrangement. In contrast, the second embodiment of the present invention, as shown in FIG. 2, performs processing similar to that of the first embodiment with respect to a block included in IC data 42, 43 of different semiconductor devices formed by the same basic figures.

Figure 16:
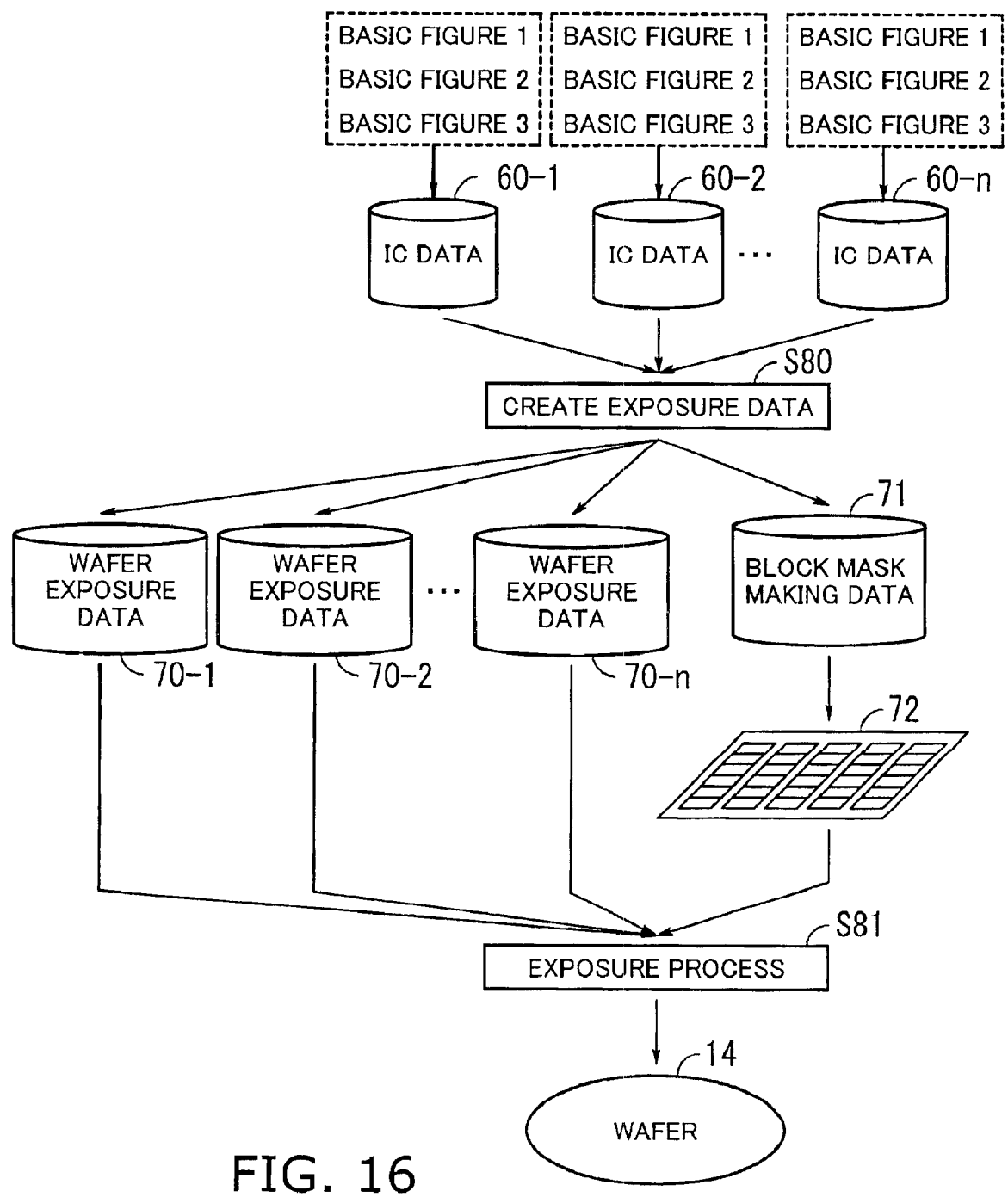
FIG. 16 is a view of a second embodiment of the present invention.
Figure 17:
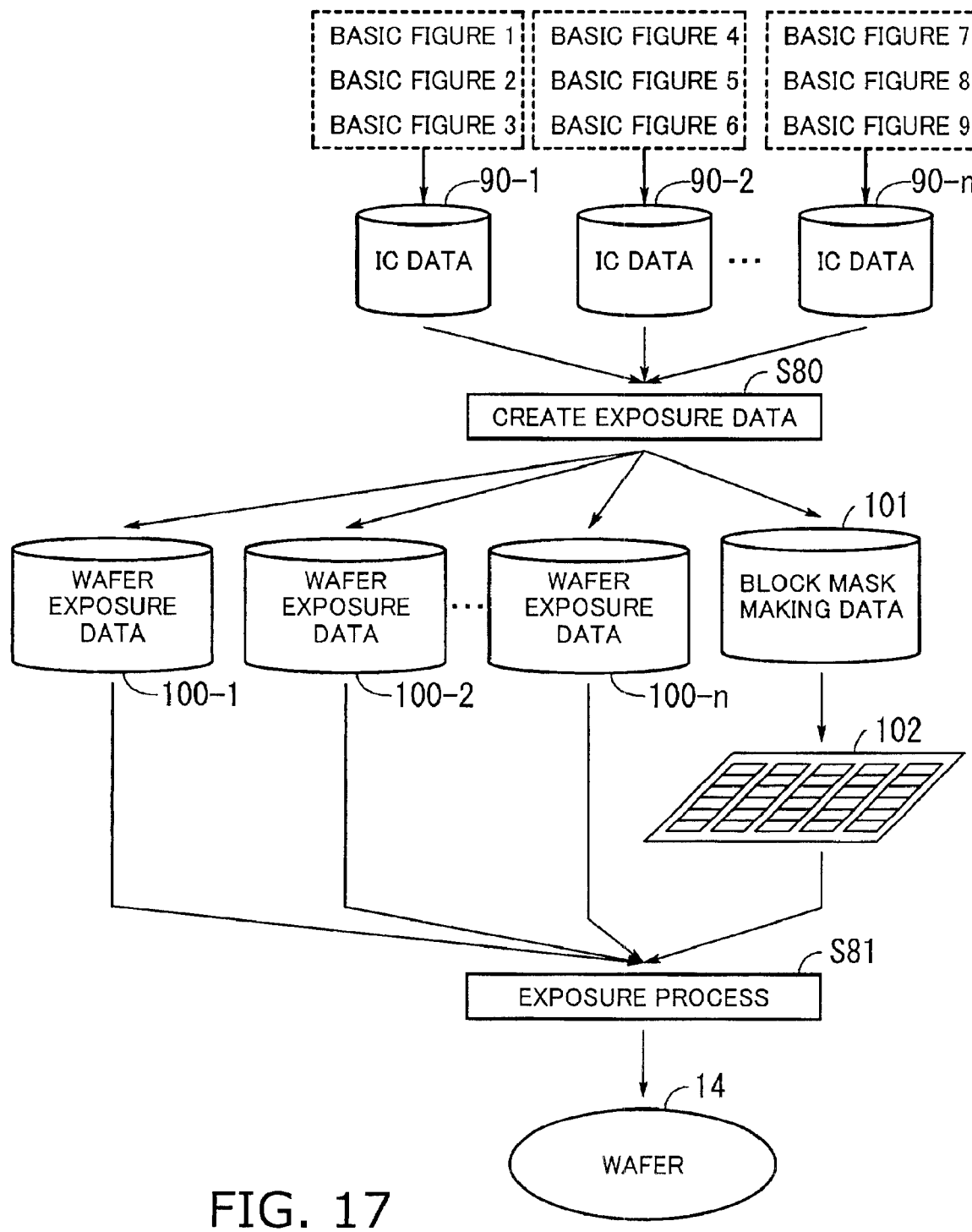
FIG. 17 is a view of a third embodiment of the present invention.

In an example illustrated in FIG. 16, an exposure data producing process of step S80 is performed with respect to items 60-1 through 60-n of IC data of different semiconductor devices formed by the same basic figures. This results in items 70-1–70-n of wafer exposure data for the respective ICs, and block mask making data 71.

Then, a block mask 72 common to all ICs is produced from the block mask making data 71.

In subsequent step S81, wafer exposure data is selected based on the type of ICs to be fabricated. In this case, the common block mask 72 can be used independent of the type of ICs.

Figure 18:
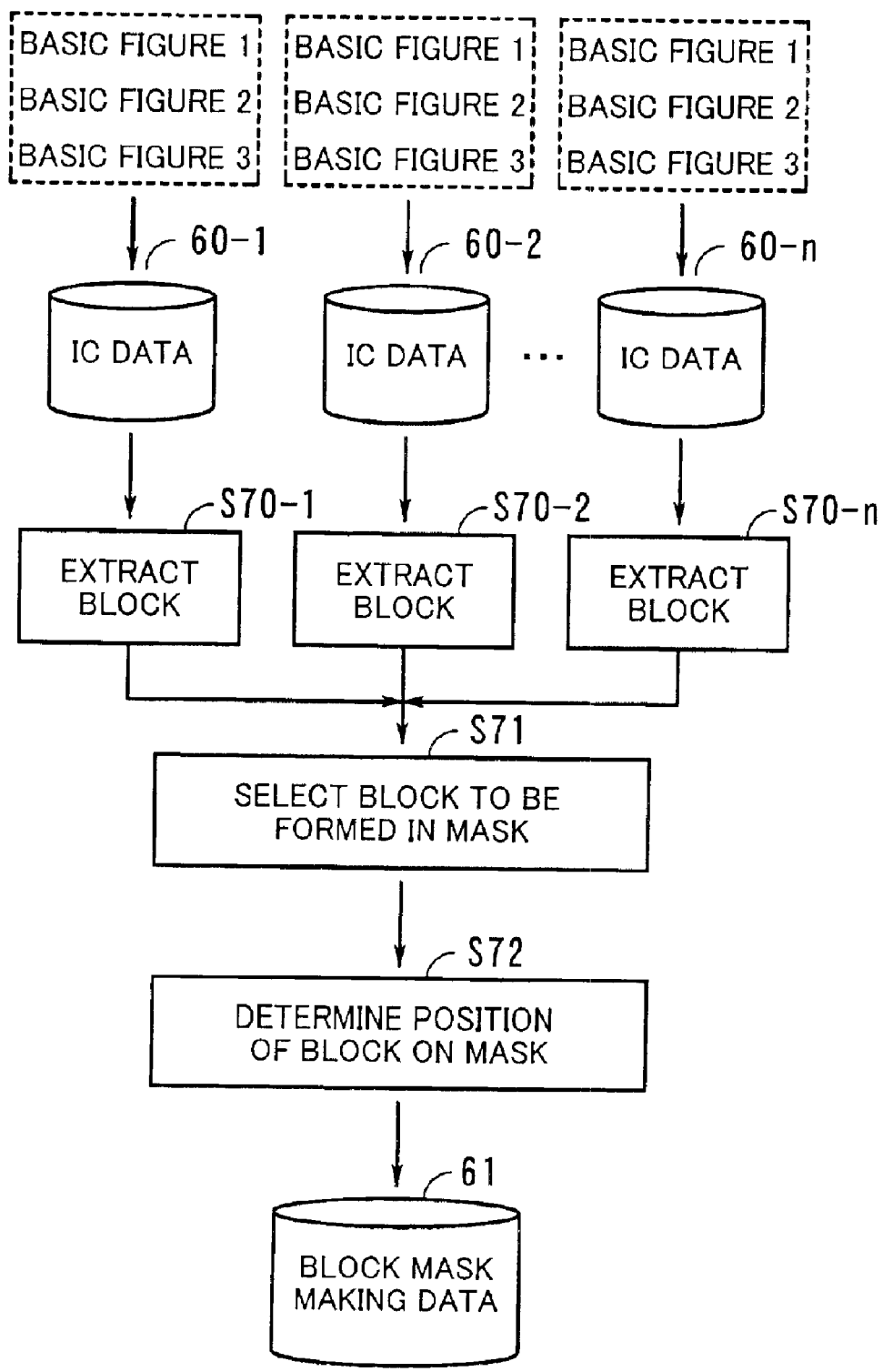
FIG. 18 is a view of a process for making a block mask according to the second embodiment of the present invention shown in FIG. 16.

Next, a description will be given, with reference to FIG. 18, of an example of the block mask making process according to the second embodiment of the present invention.

In an example of this figure, blocks are extracted from items 60-1–60-n of IC data respectively corresponding to n semiconductor devices by steps S70-1–S70-n.

Next, in step S71, blocks that are to be formed in the mask are selected from among the blocks extracted in the abovementioned manner. The criterion for selection is the same as that in the aforementioned first embodiment of the present invention.

Then, at step S72, the positions in which the blocks are arranged are determined in the same manner as that of the first embodiment of the present invention.

The block mask making data 61 thus produced is stored in database.

Figure 3:
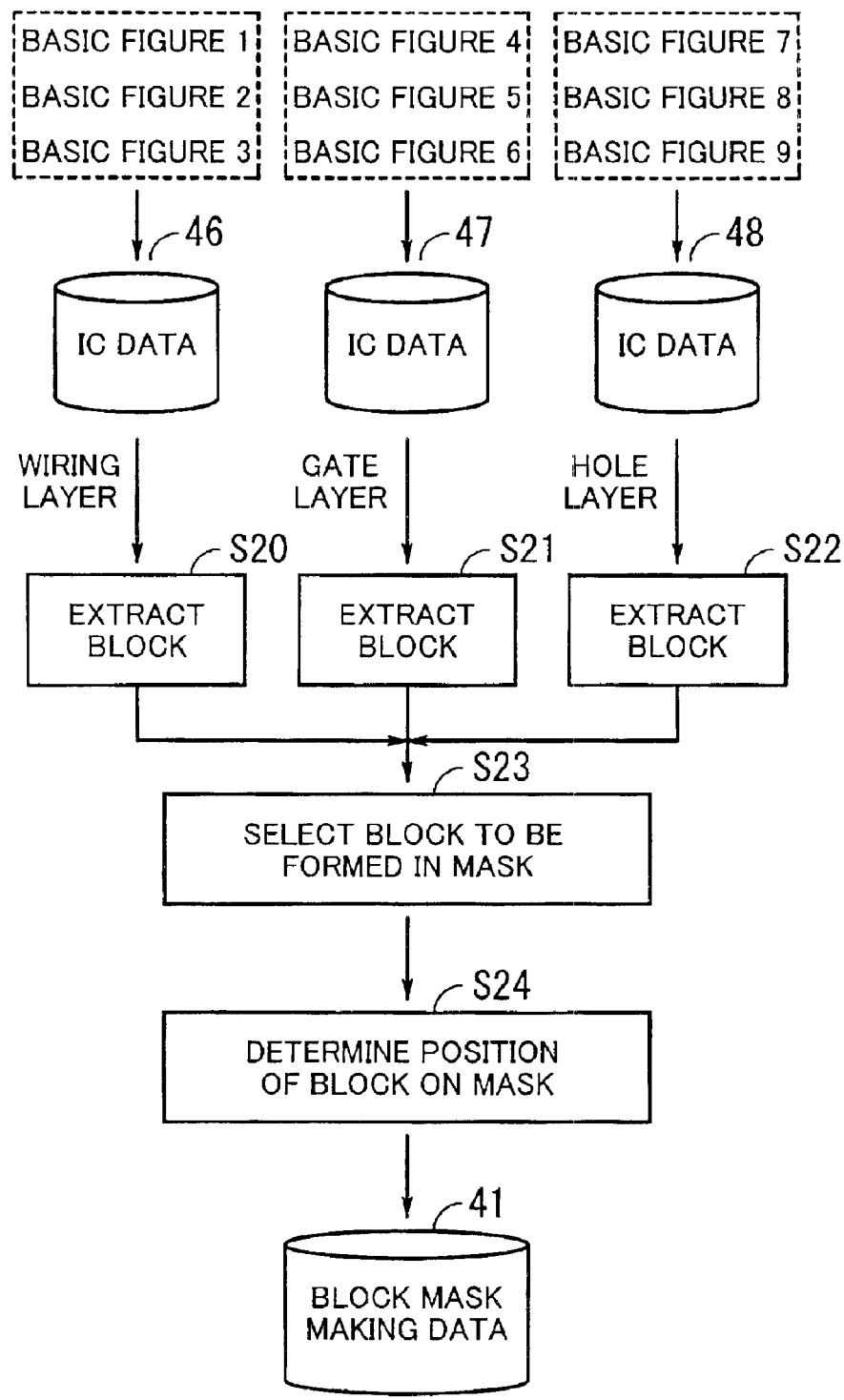
FIG. 3 is a view of yet another embodiment of the block mask making method of the invention.

In the third embodiment of the present invention, as shown in FIG. 3, the same process as that of the first embodiment of the present invention is carried out with respect to blocks included in IC data 46, 47 of different semiconductor devices formed by different basic figures. In the third embodiment of the present invention shown in FIG. 17, the exposure data creating process of step S80 is performed with respect to items 90-1–90-n of IC data of different semiconductor devices formed by different basic figures. This results in items 100-1–100-n of wafer exposure data for respective ICs and block mask making data 101.

Then, block mask 102 common to all ICs is produced from the block mask making data 101.

In subsequent step S81 of exposure process, wafer exposure data is selected in accordance with type of ICs to be fabricated, and exposure is performed using the same block mask 102 independently of the type of ICs.

Figure 19:
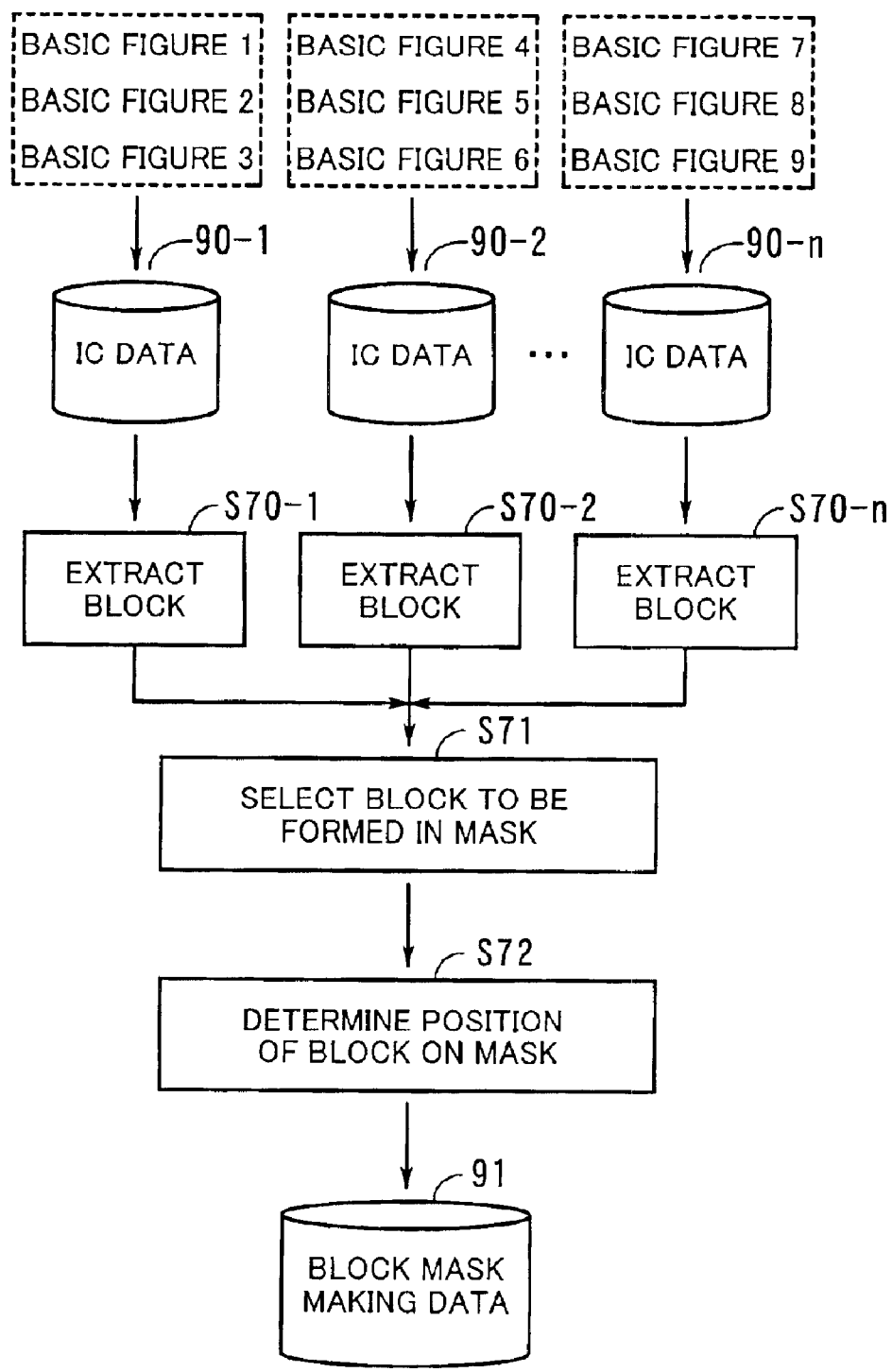
FIG. 19 is a view of a process for making a block mask according to the third embodiment of the present invention shown in FIG. 17.
Figure 20:
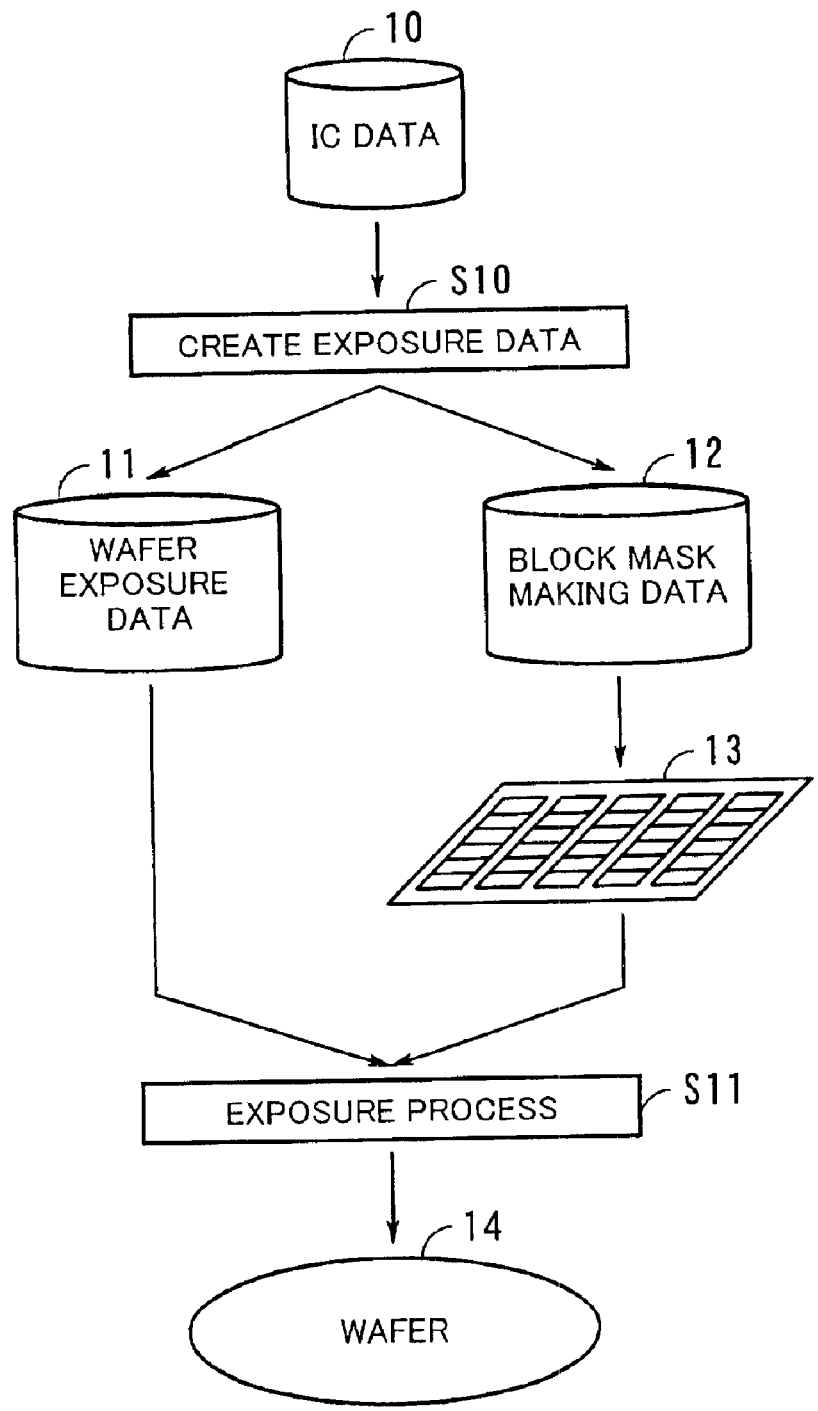
FIG. 20 is a view of a sequence of a conventional exposure method using the block mask.
Figure 21:
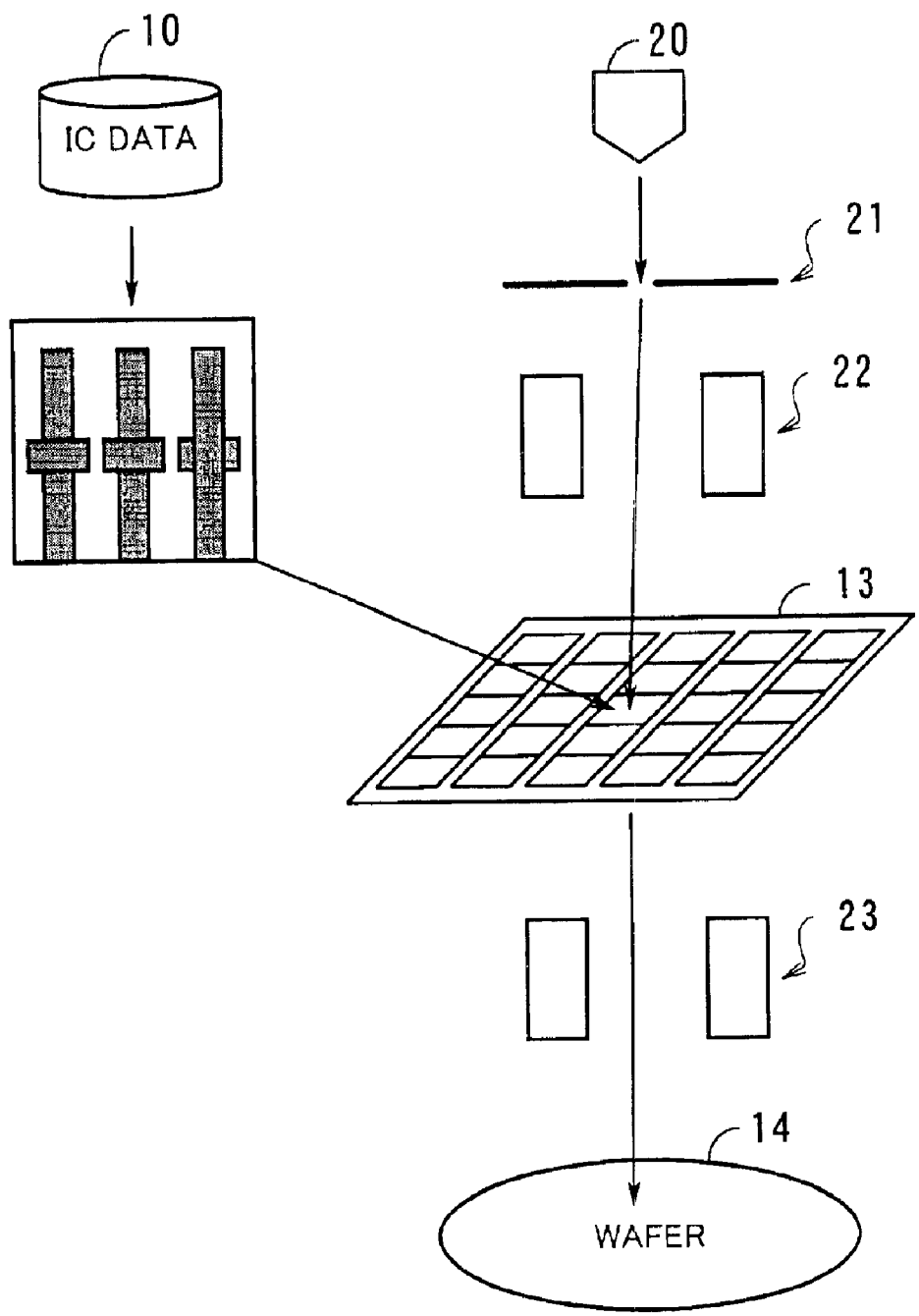
FIG. 21 is a block diagram of an outline of a conventional exposure apparatus.
Figure 22:
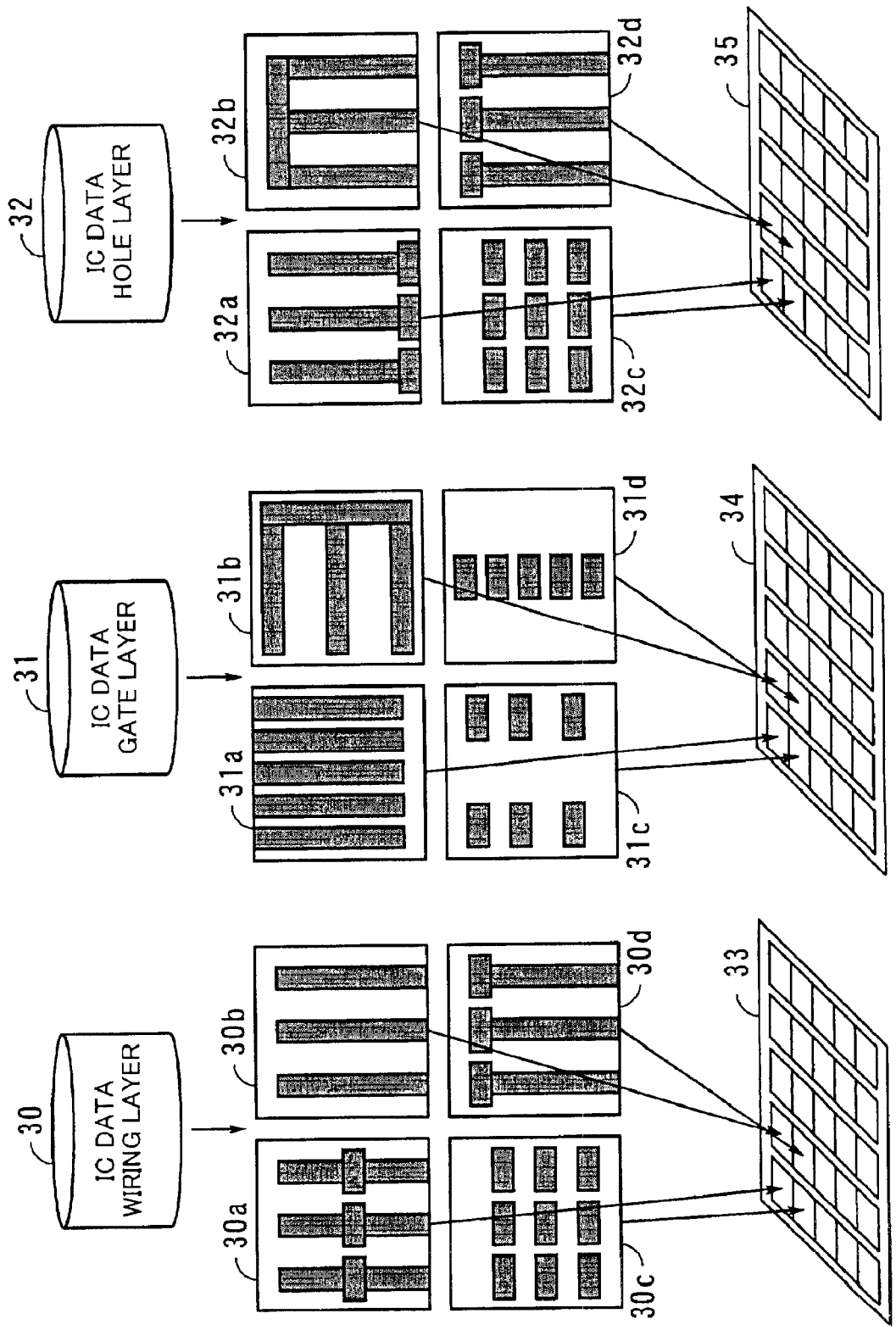
FIG. 22 is a view of IC data and block masks associated therewith in a conventional manner.

Next, a description will be given, with reference to FIG. 19, of an example of the block mask making process according to the third embodiment of the present invention.

In this figure, blocks are extracted from items 90-1–90-n of n semiconductor devices by steps S70-1–S70-n.

In step S71, blocks that are to be formed in the mask from among the blocks thus extracted are selected. The criterion for selection is the same as that of the first embodiment of the present invention.

In step S72, the position of forming the blocks on the mask is determined. The method of this determination is the same as that of the first embodiment of the present invention.

Block mask making data 91 thus produced is stored in the database.

Figure 11:
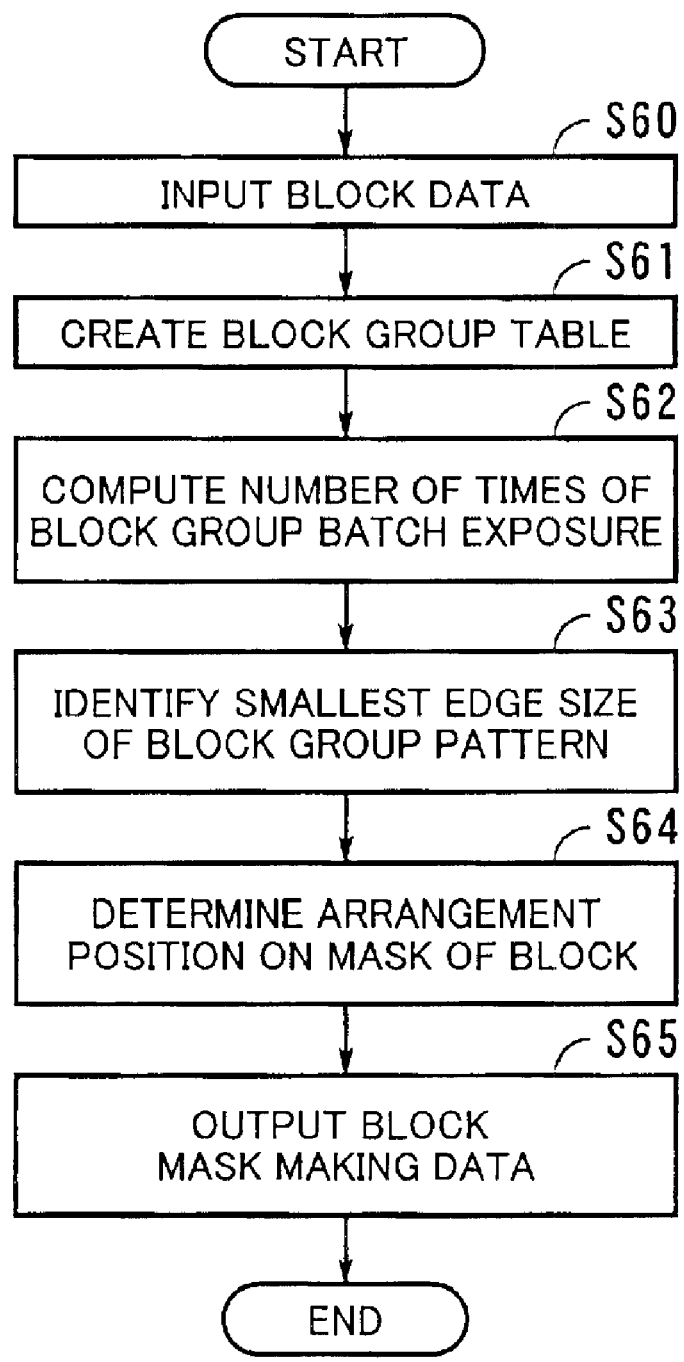
FIG. 11 is a flowchart of a sequence for arranging blocks selected by the process shown in FIG. 6 on a block mask.

The block mask is made by performing the same process as FIG. 11 with respect to the block mask forming data produced in the above-mentioned manner.

If a block extracted from IC data of the same layer of the same product type is arranged close to the center, it is possible to reduce the movement of the electron beam and speed up the exposure process.

As described above, according to the second and third embodiments of the present invention, the block mask common to IC data of different semiconductor devices formed by identical or different basic patterns is made, so that the cost and time for making the block mask can be reduced.

In addition, it is possible to avoid troublesome mask replacement and improve throughput.

As described above, according to the present invention, there is provided a method of making a block mask used for pattern batch exposure, comprising: an extraction step of extracting blocks from basic figures that belong to one or more layers of a semiconductor device and form an integrated circuit; and an arrangement determining step of determining an arrangement of the blocks extracted by the extraction step on a block mask. Thus, as compared to layer-based block mask making, the cost and time can be reduced.

Also, in the block mask used for pattern batch exposure, blocks extracted from basic figures that belong to one or more layers of the semiconductor device. This avoids troublesome replacement of block mask and improves throughput in fabrication of semiconductor devices.

Further, in an exposure apparatus drawing a circuit pattern on a semiconductor substrate by exposure, such exposure is performed using a block mask made by steps of: extracting blocks from basic figures forming an integrated circuit that belongs to one or more layers of a semiconductor device; and determining an arrangement of the blocks extracted on the block mask. Thus, this avoids troublesome replacement of block mask and improves throughput in fabrication of semiconductor devices.

The foregoing is considered as illustrative only of the principles of the present invention. Further, since numerous modifications and changes will readily occur to those skilled in the art, it is not desired to limit the invention to the extract construction and applications shown and described, and accordingly, all suitable modifications and equivalents may be regard as falling within the scope of the invention in the appended claims and their equivalents.

What is claimed is:

1. A method of making a block mask used for pattern batch exposure, comprising:
   an extraction step of extracting blocks from basic figures that belong to one or more layers of a semiconductor device and form an integrated circuit; and
   an arrangement determining step of determining an arrangement of the blocks extracted by the extraction step on a block mask, wherein the extraction step comprises:
   a unifying step of unifying overlapping blocks among the blocks extracted; and
   a priority-based forming step of preferentially forming blocks having a relatively large value obtained by subtracting a number of times of block exposure from a number of times of variable rectangular beam exposure.

2. The method according to claim 1, wherein the arrangement determining step arranges a block having a smaller exposure pattern closer to a center of the block mask.

3. The method according to claim 1, wherein the arrangement determining step arranges a block used more frequently closer to a center of the block mask.

4. The method according to claim 1, wherein the arrangement determining step arranges, close to a center of the block mask, blocks formed by an identical basic figure and extracted from an identical layer.

5. The method according to claim 1, wherein blocks extracted from different layers of a semiconductor device are formed in a single block mask.

6. The method according to claim 1, wherein blocks extracted from one or more layers of different semiconductor devices formed by an identical figure are formed in a single block mask.

7. The method according to claim 1, wherein blocks extracted from one or more layers of different semiconductor devices formed by different figures are formed in a single block mask.

8. The method according to claim 1, wherein a process of extracting blocks from one or more layers of a plurality of semiconductor devices is executed by a plurality of CPUs.

9. The method according to claim 1, wherein the arrangement determining step preferentially selects and arranges basic figures used more frequently in case where the number of basic figures is larger than a number of basic figures that can be arranged on the block mask.

10. The method according to claim 1, wherein the arrangement determining step preferentially selects and arranges basic figures having a relatively large value obtained by subtracting a number of times of block exposure from a number of times of variable rectangular beam exposure in case where a number of basic figures of different semiconductor devices exceeds a number of basic figures that can be arranged on the block mask.

* * * * *